United States Patent
Bolvardi et al.

(10) Patent No.: US 12,173,410 B2
(45) Date of Patent: Dec. 24, 2024

(54) COATING FOR ENHANCED PERFORMANCE AND LIFETIME IN PLASTIC PROCESSING APPLICATIONS

(71) Applicant: Oerlikon Surface Solutions AG, Pfäffikon, Pfäffikon (CH)

(72) Inventors: Hamid Bolvardi, Chur (CH); Ali Khatibi, Chur (CH); Jürgen Ramm, Maienfeld (CH); Mirjam Arndt, Bad Ragaz (CH); Florian Neff, Sargans (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/293,972

(22) PCT Filed: Nov. 14, 2019

(86) PCT No.: PCT/EP2019/081412
§ 371 (c)(1),
(2) Date: May 14, 2021

(87) PCT Pub. No.: WO2020/099605
PCT Pub. Date: May 22, 2020

(65) Prior Publication Data
US 2022/0002880 A1    Jan. 6, 2022

Related U.S. Application Data (60) Provisional application No. 62/760,983, filed on Nov. 14, 2018.

(51) Int. Cl.
*C23C 28/04*    (2006.01)
*B23C 5/16*    (2006.01)
(Continued)

(52) U.S. Cl.
CPC ............ *C23C 28/04* (2013.01); *B23C 5/16* (2013.01); *C23C 14/024* (2013.01);
(Continued)

(58) Field of Classification Search
CPC ............ C23C 14/024; C23C 14/0641; C23C 14/0676; C23C 14/08; C23C 28/04
(Continued)

(56) References Cited

U.S. PATENT DOCUMENTS 4,357,382 A    11/1982    Lambert et al.
6,274,257 B1 *    8/2001    Aharonov .............. B22C 3/00
                                                            427/255.31
(Continued)

FOREIGN PATENT DOCUMENTS

CN    102015229    4/2011
CN    103256142 A *    8/2013
(Continued)

OTHER PUBLICATIONS

Diaz-Guillen, et al., "Electrochemical Corrosion Performance of AISI D2 Tool Steel Surface Hardened by Pulsed Plasma Nitriding", Jan. 1, 2013, Int. J. Electrochem. Sci., vol. 8, pp. 973-982 (Year: 2013).*

(Continued)

*Primary Examiner* — Seth Dumbris (57) ABSTRACT

An improved coating used in plastic processing applications including a first layer system that includes at least one corrosion resistant material layer; a second layer system that includes at least one abrasion resistant material layers; and a transition layer provided between the first layer and the second layer. The coating is resistant to both abrasion and corrosion, while maintaining ductility and impact resistance.

8 Claims, 4 Drawing Sheets

(51) Int. Cl.
  *C23C 14/02* (2006.01)
  *C23C 14/06* (2006.01)
  *C23C 14/08* (2006.01)
  *C23C 28/00* (2006.01)

(52) U.S. Cl.
  CPC ...... *C23C 14/0641* (2013.01); *C23C 14/0676* (2013.01); *C23C 14/08* (2013.01); *C23C 28/042* (2013.01); *C23C 28/3455* (2013.01); *C23C 28/42* (2013.01)

(58) Field of Classification Search
  USPC .......................................................... 428/472
  See application file for complete search history.

(56) References Cited

U.S. PATENT DOCUMENTS

| | | | |
|---|---|---|---|
| 7,879,443 | B2 | 2/2011 | Endrino |
| 8,435,651 | B2 | 5/2013 | Minami et al. |
| 8,529,735 | B2 | 9/2013 | Kurapov |
| 9,581,104 | B2 | 2/2017 | Lehnert et al. |
| 10,174,416 | B2 | 1/2019 | Ramm |
| 10,906,270 | B2 | 2/2021 | Konno |
| 2001/0028926 | A1* | 10/2001 | Strondl ................ C23C 14/025 428/220 |
| 2006/0032602 | A1* | 2/2006 | Inoue .................... C23C 28/044 164/312 |
| 2008/0073482 | A1* | 3/2008 | Inoue .................... C23C 30/005 249/116 |
| 2010/0129644 | A1 | 5/2010 | Endrino |
| 2012/0009398 | A1 | 1/2012 | Chang et al. |
| 2012/0244382 | A1* | 9/2012 | Chang ................ C23C 14/0036 204/192.15 |
| 2015/0107544 | A1 | 4/2015 | Lehnert et al. |
| 2015/0273724 | A1* | 10/2015 | Minami ................ C23C 28/048 428/141 |
| 2016/0060746 | A1 | 3/2016 | Ramm |
| 2016/0138153 | A1* | 5/2016 | Sobiech .............. C23C 14/0042 204/192.15 |
| 2016/0186307 | A1* | 6/2016 | Sukadhare .............. A61L 2/232 204/192.15 |
| 2019/0226075 | A1* | 7/2019 | Derflinger .......... C23C 14/0042 |

FOREIGN PATENT DOCUMENTS

| | | |
|---|---|---|
| CN | 105143498 | 12/2015 |
| CN | 108481589 | 9/2018 |
| DE | 102005061060 | 6/2007 |
| DE | 102010052687 | 5/2012 |
| JP | 04-337084 | 11/1992 |
| JP | 2008-529809 | 8/2008 |
| JP | 2012-505308 | 3/2012 |
| JP | 2012-132042 | 7/2012 |
| JP | 2014-012896 | 1/2014 |
| JP | 2015-078693 | 4/2015 |
| JP | 2016-520719 | 7/2016 |
| JP | 2018-031334 | 3/2018 |
| WO | WO 2020/099605 | 5/2020 |

OTHER PUBLICATIONS

International Preliminary Report on Patentability dated May 18, 2021 From the International Bureau of WIPO Re. Application No. PCT/EP2019/081412. (6 Pages).

International Search Report and the Written Opinion dated Jan. 20, 2020 From the International Searching Authority Re. Application No. PCT/EP2019/081412. (12 Pages).

Examination Report Under Sections 12 & 13 of the Patents Act, 1970 and the Patents Rules, 2003 dated Oct. 31, 2022 From the Government of India, Intellectual Property India, Patents, Designs, Trade Marks, Geographical Indications, The Patent Office Re. Application No. 202127018907. (6 Pages).

Notification of Office Action and Search Report dated Feb. 2, 2023 From the National Intellectual Property Administration of the People's Republic of China Re. Application No. 201980074490.0 and Its Translation Into English. (30 Pages).

Notice of Reasons of Refusal dated Aug. 29, 2023 From the Japan Patent Officce Re. Application No. 2021-526363 and Its Translation Into English. (8 Pages).

Notification of Office Action and Search Report dated Aug. 28, 2023 From the National Intellectual Property Administration of the People's Republic of China Re. Application No. 201980074490.0 and Its Translation Into English. (41 Pages).

Relatorio de Busca e Parecer [Search Report and Written Opinion] dated Aug. 17, 2023 From the Serviço Público Federal, Ministério do Desenvolimento, Indústria, Comércio e Serviços, Instituto Nacional da Propriedade Industrial do Brasil, INPI Rc. Application No. BR112021009483-0 and Its Translation Into English. (8 Pages).

Notice of Comment Dated Aug. 25, 2024 From the Korean Intellectual Property Office Re. Application No. 10-2021-7018059 and Its Translation Into English. (11 Pages).

\* cited by examiner

COATING FOR ENHANCED PERFORMANCE AND LIFETIME IN PLASTIC PROCESSING APPLICATIONS

RELATED APPLICATIONS

This application is a National Phase of PCT Patent Application No. PCT/EP2019/081412 having International filing date of Nov. 14, 2019, which claims the benefit of priority under 35 USC § 119(e) of U.S. Provisional Patent Application No. 62/760,983 filed on Nov. 14, 2018. The contents of the above applications are all incorporated by reference as if fully set forth herein in their entirety.

FIELD AND BACKGROUND OF THE INVENTION

The present invention relates to coatings, and more particularly, to coatings used in plastic processing applications.

Figure 1:
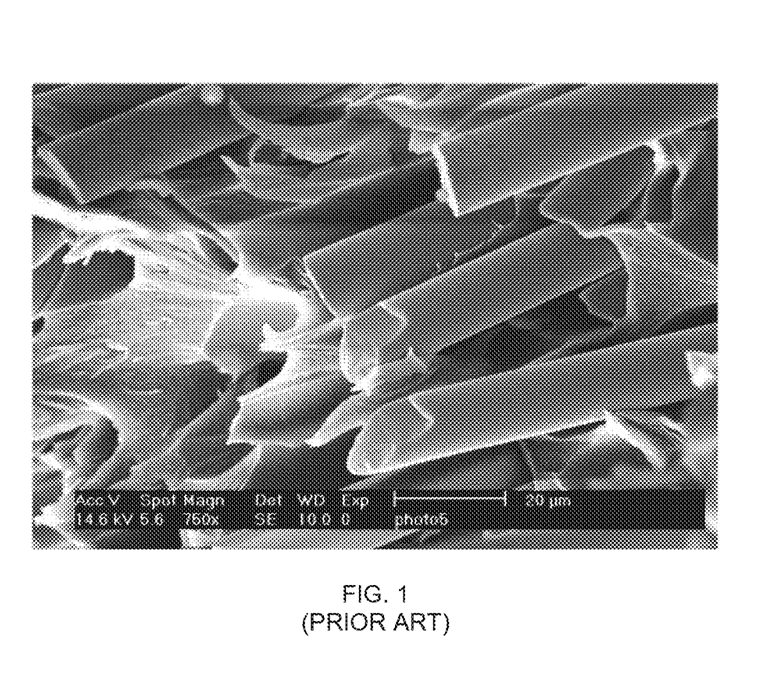
FIG. 1 illustrates a prior art cross sectional image of glass fiber reinforced plastics.

Plastic processing applications like injection molding or extrusion includes various stages where metal tools can come into physical contact with plastic. This contact can cause the tool, e.g. injection molds, to suffer from a combined corrosive and abrasive attack. Corrosive media induced by plastics can originate from various components of the plastics, such as softener, colors, and free hydrochloric acid. At the same time, the increasing interest in use of glass fiber reinforced plastics in different plastic processing applications, e.g. injection molding produced parts for automotive industry, has led to more abrasive wear on tools. Glass fiber reinforced plastics with a glass fiber content of >30% are extremely abrasive and reduce the tool life. These types of polymers can be imagined as a multi-indenters carried by a fluid causing wear through micro cutting and micro ploughing and solid particle impact through plastic deformation and removal of material. FIG. 1 illustrates a scanning electron microscope (SEM) cross-section image of such glass fiber reinforced plastics. The movement of glass fibers over the tool surface can cause scratches, which deteriorate the surface quality of the mold and subsequently produced plastic parts. This imposes either a need for maintenance, e.g. polishing the tool surface, or a complete tool failure.

Figure 2:
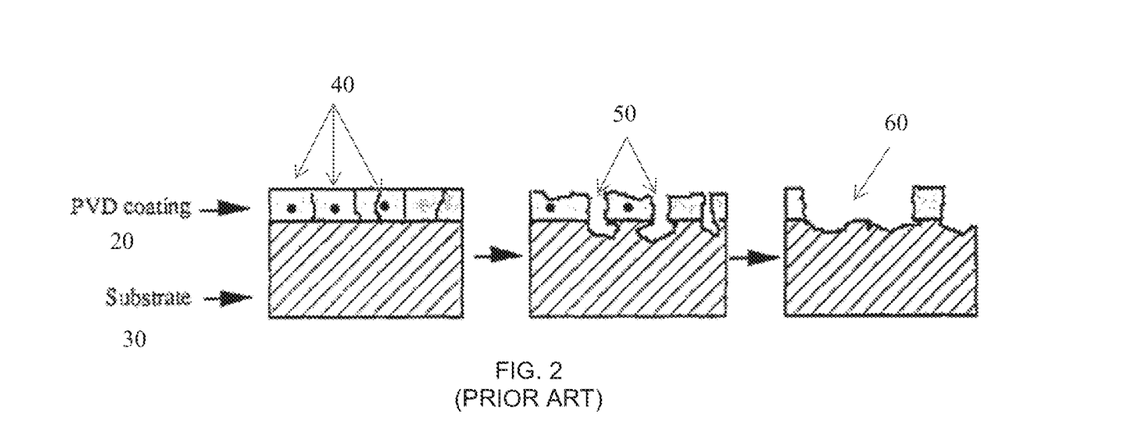
FIG. 2 illustrates a prior art coated substrate with corrosion apparition and corrosion failure.

To protect the tools against combined corrosive and abrasive attacks during plastic processing applications, several coatings and deposition techniques have been tested so far such as high velocity oxy-fuel (HVOF), hard chromium or nickel-phosphorus metallic coatings, physical vapor deposition (PVD) or chemical vapor deposition (CVD) titanium, aluminum and other carbide or nitride layers. Ceramic coatings deposited by PVD are of great interest since they theoretically can simultaneously exhibit high hardness and chemical inertness. Therefore, ceramic coatings should, in theory, separate the substrate from the aggressive environment and hence protect the substrate. Nevertheless, it is well documented that most of the times using ceramic coatings on many steel types could only marginally, if at all, enhance the corrosion resistance of steel substrates in corrosive environments. As shown in FIG. 2, a PVD coating 20 applied to a substrate 30 includes a plurality of defects, such as pinholes 40. These defects provide fast diffusion paths for corrosive media, chloride ions, to reach the substrate and create a galvanic cell at the interface of coating and substrate since ceramic coatings are electrochemically more stable than most substrate materials (e.g. steels). The corrosion rate at the interface can be very high since coating as a cathode has a large area over a very small area on the exposed substrate as anode. Therefore, coating cannot protect substrate anymore. The corrosion propagates laterally along the interface between the coating and the substrate resulting in partial degradation or delamination 50 of the coating and apparition of corrosion wear at the substrate and finally leading to a complete coating failure, where a total or almost total degradation or delamination 60 of the coating and corrosion of the substrate is observed.

Furthermore, the abrasive attack and cracking of brittle ceramic coatings due to high imposed loads or impact during application can further accelerate the corrosive failure of the coating. Therefore, in processing of glass fiber reinforced plastics with very high abrasive resistance, high corrosion resistances as well as some level of ductility and impact resistance are simultaneously required.

SUMMARY OF THE INVENTION

The object of the present invention is to alleviate or overcome one or more difficulties relating to the state of the art. In particular, the object of the present invention is to provide a coating for effective and safe protection of tools, in particular tools for use in plastics processing, against combined corrosive and abrasive attacks.

The following presents a simplified summary in order to provide a basic understanding of the embodiments described herein. This description is not an extensive overview nor is it intended to identify key or critical elements. Its sole purpose is to present some concepts in a simplified form as a prelude to the more detailed description that is presented later.

In accordance with a first aspect of the invention, a coating for a substrate is provided. The coating includes: a first layer comprising at least one corrosive resistant material layer; a second layer comprising at least one abrasive resistant material layer; and a transition layer provided between the first layer and the second layer, wherein the first layer is deposited closer to the substrate than the second layer. Since the first layer is designed comprising at least one corrosive resistant material layer (hereinafter also referred as corrosion resistant material layer), the first layer must be understood as a layer system that is formed of one or more layers. Likewise, since the second layer is designed comprising at least one abrasive resistant material layer (hereinafter also referred as abrasion resistant material layer), the second layer must be understood as a layer system that is formed of one or more layers. The transition layer must also be understood as a layer system that is formed of one or more layers, for example can be formed of one or more gradient layers.

Therefore the above-mentioned inventive coating should be also understood as comprising:

- a first coating layer system formed by one or more layers, where said first layer system comprises at least one corrosion resistant layer;
- a second coating layer system formed by one or more layers, where said second layer system comprises at least one abrasive resistant layer (also called abrasion resistant layer); and
- a transition layer system formed by one or more layers, where said transition layer system is provided between the first layer system and the second layer system, the one or more layers in the transition layer system can be for example gradient layers but can be also non-gradient layers as well as a combination of gradient and non-gradient layers.

In another example of the first aspect, the first layer is part of a first layer system deposited closer to the substrate than the second layer, said first layer system comprising one or more corrosion resistant layers, wherein at least one corrosion resistant layer being an AlCrO layer.

In another example of the first aspect, the second layer is part of a second layer system deposited more distant from the substrate than the first layer system, said second layer system comprising one or more abrasion resistant layers, wherein at least one abrasion resistant layer being a CrON layer.

In another example of the first aspect, the transition layer is part of a transition layer system, said transition layer system comprising one or more transition layers, wherein at least one transition layer being a CrON layer.

In another example of the first aspect, the transition layer system comprises a $Cr_2O_3$ layer.

In another example of the first aspect, the second layer system comprises at least one CrN layer.

In another example of the first aspect, the second layer system comprises at least one CrO layer.

In another example of the first aspect, the second layer system comprises at least one $Cr_2O_3$ layer deposited as outermost layer.

In another example of the first aspect, the first layer system comprises at least one AlCrN layer deposited between the substrate and the AlCrO layer.

In another example of the first aspect, at least one adhesion layer is deposited between the substrate and the first layer or between the substrate and the first layer system.

In another example of the first aspect, the at least one adhesion layer is a CrN layer.

In another example of the first aspect, the first layer or the first layer system includes one or more layers of the following materials: aluminum chromium oxide (AlCrO), aluminum chromium oxynitride (AlCrON), chromium oxides ($CrO_x$), and chromium (III) oxide ($Cr_2O_3$).

In another example of the first aspect, the second layer or the second layer system includes one or more layers of the following materials: chromium (Cr), chromium nitride (CrN), chromium oxynitride (CrON), chromium oxides ($CrO_x$), and chromium (III) oxide ($Cr_2O_3$).

In another example of the first aspect, the second layer system has a hardness between 29 GPa and 33 GPa.

In another example of the first aspect, the first layer or the first layer system is a multilayer part including at least one of AlCrO, AlCrON, $CrO_x$, and $Cr_2O_3$.

In another example of the first aspect, the second layer or the second layer system is a multilayer part including at least one of Cr, CrN, CrON, $CrO_x$, and $Cr_2O_3$.

In a second aspect of the present invention, a substrate is disclosed having a coating as previously described above, wherein the surface on which the coating is deposited is made of a material including a ferrous metal.

In another example of the second aspect, the surface on which the coating is deposited is made of a material including steel or is made of a material of the type steel.

In a third aspect of the present invention, a method of coating a substrate is provided. The method includes providing a substrate; coating the substrate with multiple layers of corrosive resistant materials; coating the multiple layers of corrosive resistant materials with at least one transition layer; and coating the at least one transition layer with multiple layers of abrasive resistant materials.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DESCRIPTION OF SPECIFIC EMBODIMENTS
OF THE INVENTION

Examples incorporating one or more embodiments of the present invention are described and where appropriate illustrated in the drawings. These described and/or illustrated examples are not intended to be limiting. For example, one or more aspects of an embodiment of the present invention may be utilized in other embodiments and even other types of substrates (e.g. tools, components or devices).

Figure 3:
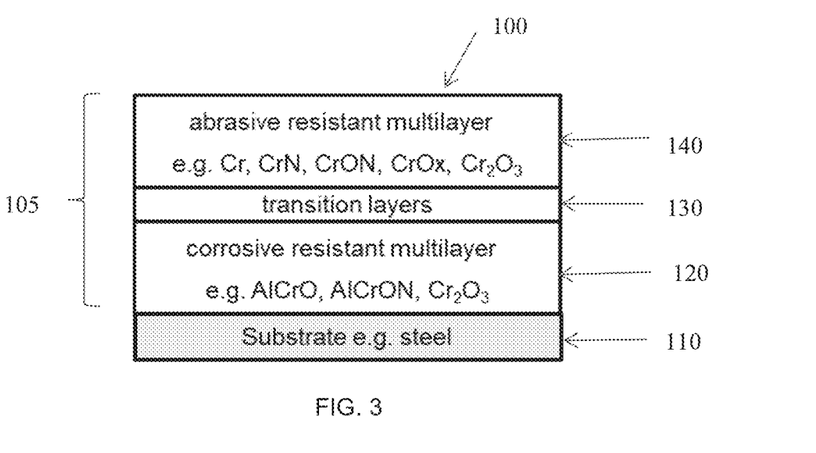
FIG. 3 illustrates schematically an example of an inventive coating 105 deposited on a surface of a substrate 110 according to one embodiment of the present invention, in which: the second layer system 140 is a multilayer film comprising layers for example of the type Cr, CrN, CrON, $CrO_x$ or $CrO_3$; the first layer system 120 is a multilayer film comprising layers for example of the type AlCrO, AlCrON, $Cr_2O_3$; the transition layer or transition layers 130 are deposited between the first layer system 120 and the second layer system 140.

Described herein is an example of a coating architecture with multilayers and material selections that exhibit high abrasive resistance and high corrosive resistance as well as ductility and impact resistance. A corrosion attack typically occurs at an interface between a coating and a substrate. Accordingly, a corrosive resistant layer or a corrosive resistant part of a multilayer coating can be provided at this interface. Turning now to FIG. 3, an example of a corrosive resistance part 100 (e.g. part of a component, tool or device coated with a coating comprising a corrosive resistant part according to the present invention) is illustrated. In this example a corrosive and abrasive resistant coating 105 is applied to a substrate 110. The substrate 110 can be a tool, such as an injection mold, with a ferrous metal surface, such as steel or cast iron. However, the coating 105 can be applied to non-ferrous metal surfaces as well. The coating 105 includes a first layer system 120 comprising at least one corrosive resistant layer, exhibiting in this manner corrosive resistant properties. For example, the first layer system 120 can include one or more layers of aluminum chromium oxide (AlCrO), aluminum chromium oxynitride (AlCrON), chromium oxides ($CrO_x$), and/or chromium (III) oxide ($Cr_2O_3$). Such corrosive resistant oxide and oxynitrides layers act as an insulator to mitigate outward diffusions of electrons and also as a barrier for the inward diffusion of corrosive ions from the environment. These layers prevent or slow down the diffusion of corrosive ions.

A second layer system 140 can be provided on top of the first layer system 120. The second layer system 140 can be deposited as monolayer or multilayer including one or more abrasive resistant layers for exhibiting in this manner abrasive resistant properties. This second layer system 140 protects the substrate 110 against abrasive wear and the at least one corrosive resistant layer forming the first layer system 120 protects the substrate against corrosive wear, in this manner the inventive coating 105 provides to the substrate 110 besides good corrosion resistance properties also resistance against both abrasive wear and mechanical loads during application. More specifically, the second layer system 120 can include one or more of the following layers for forming a multilayer: chromium (Cr), chromium nitride (CrN), chromium oxynitride (CrON), chromium oxides ($CrO_x$), and/or chromium (III) oxide ($Cr_2O_3$).

The resultant coating can have a high hardness of 31±2 GPa, where the coating can be deposited exhibiting a multilayer structure comprising individual layers with respective individual layer thickness in micro-meter range and/or in nano-meter range. This structure exhibits higher ductility and crack deflection as well as being highly abrasive resistant and tolerant of mechanical loads. As show in FIG. 3 at least one transition layer 130 can be provided between the first layer 120 and the second layer 130 to mitigate delamination of the corrosive and abrasive resistant parts. Since layers have different crystal structures and lattice parameters as well as chemical compositions, a precise transition (comprising one or more transition layers) can be important for example for improving cohesion within the coating 105 by increasing adhesion between the first layer system 120 and the second layer system 140.

Figure 4:
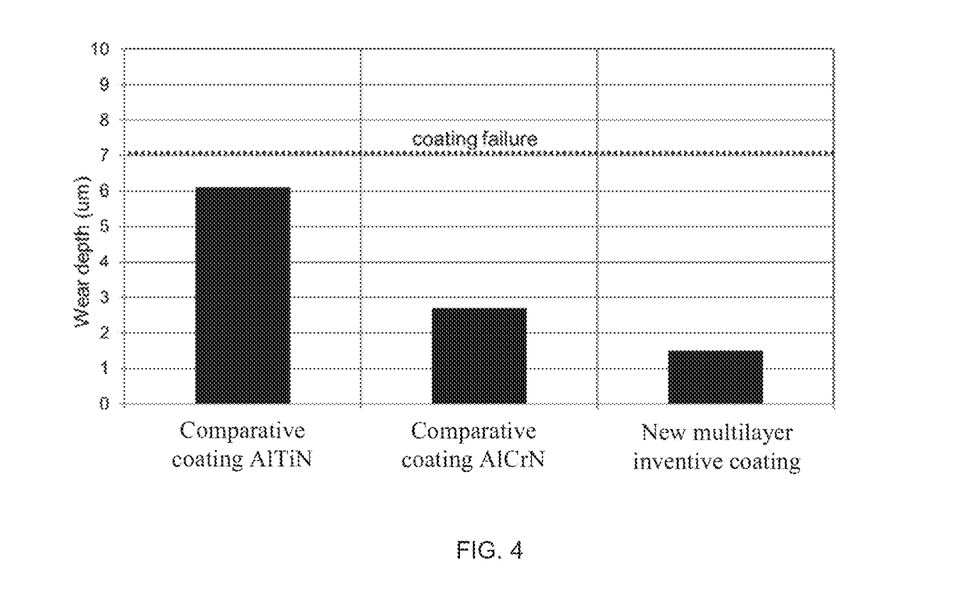
FIG. 4 illustrates abrasive resistance test results showing a comparison of the evolution of the wear depth produced under same conditions by using substrates coated with prior art comparative coatings of the type AlTiN and AlCrN as well as by using a new multilayer coating according to one embodiment of the present invention. In this graphic not any of the coatings has presented coating failure yet.

Tests were conducted in order to evaluate abrasive resistance properties of the inventive example coatings (new multilayer inventive coatings) in comparison with prior art comparative coatings against glass fiber reinforced plastics. Turning now to FIG. 4, coated steel substrates were tested against polyamide with 50% glass fiber content in a dry sliding test with 100 N perpendicular load for a distance of 120 km FIG. 4 presents the wear depth of a coating in accordance with the embodiment disclosed in FIG. 3 in comparison with conventional (prior art) abrasive resistant PVD coatings of the type aluminum chromium nitride (AlCrN) and such of the type titanium aluminum nitride (TiAlN). The superior performance of the inventive coatings in terms of abrasive resistance can be clearly seen.

Figure 5:
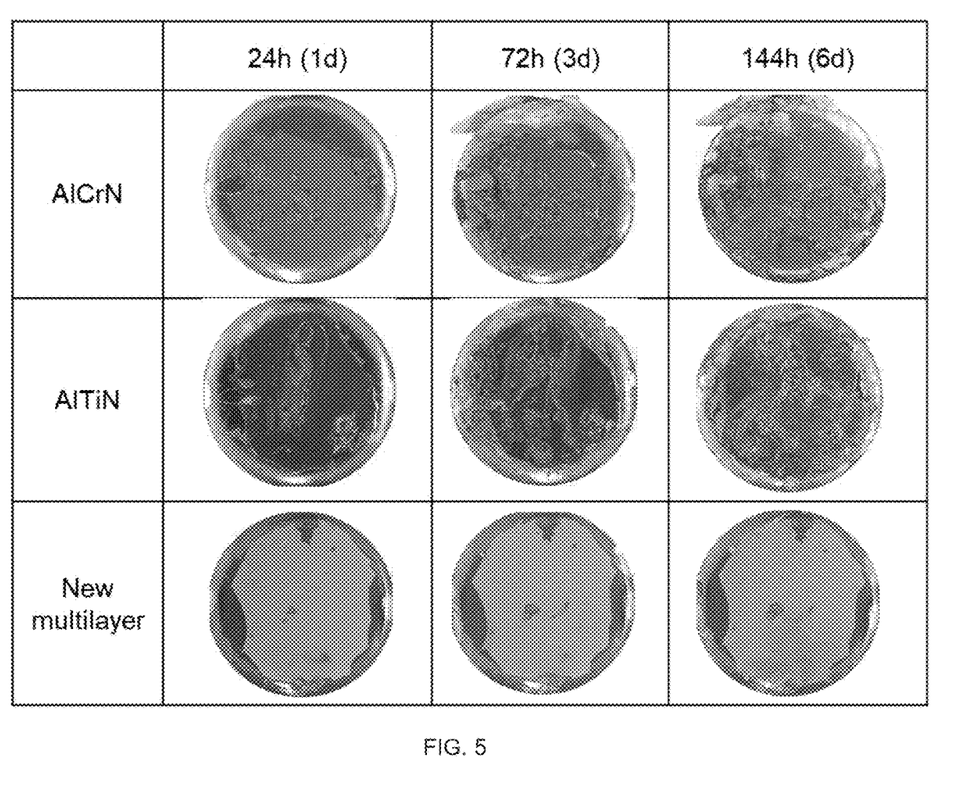
FIG. 5 illustrates corrosive resistance test results showing a comparison of the corrosion apparition and in some cases even coating failure produced under same conditions by using substrates coated with prior art comparative coatings of the type AlTiN and AlCrN as well as by using a new multilayer coating according to one embodiment of the present invention.

In order to evaluate the corrosion resistance of the inventive coatings in accordance with the embodiment disclosed in FIG. 3 in comparison with the same both above-mentioned conventional (prior art) abrasive resistant PVD coatings, a neutral salt spray test (NSST) was conducted. The coatings were applied to a substrate made of 1.2842 cold work steel with 0.4 at. % Cr. The low amount of Cr content allows for a higher galvanic potential between substrate (steel) and Cr containing coatings and therefore a higher degree and rate for corrosion during NSST. As it can be seen in FIG. 5, the conventional AlCrN and AlTiN coatings exhibited severe pitting corrosion at many spots. This pitting corrosion propagated quickly during the next days. By the $6^{th}$ day, oxidized iron from the substrate covers almost the whole surface of the coating. In contrast, the inventive coatings according to the example embodiment described in FIG. 3, showed very few minor pitting spots on the $1^{st}$ day. Moreover, this remained stable throughout the $6^{th}$ day, on which no further corrosion spot or propagation is observed.

A number of examples of inventive coatings and materials that can be used as layers in the inventive coatings have been described above. Nevertheless, it will be understood that various modifications may be made. For example, suitable results may be achieved if the described elements are combined in a different manner and/or replaced or supplemented by other elements or their equivalents. Accordingly, other implementations are within the scope of the following claims.

A preferred embodiment of the present invention refers to a coating comprising: a first layer system, a second layer system and at least one transition layer, where
    the first layer system comprises at least one AlCrN layer and preferably also at least one AlCrO layer as corrosion resistant layers,
    the second layer system comprises at least one CrON layer and preferably also at least one CrN layer and/or one CrO layer, and
    a transition layer system formed of one or more transition layers deposited between the first layer system and the second layer system, where the transition layer system comprises at least one transition layer of $Cr_2O_3$ and/or at least one transition layer of CrON, where the transition layers can be deposited as gradient layers or as non-gradient layers or as a combination of gradient and non-gradient layers.

Each one of the embodiments and preferred embodiments of the present invention described above can also include one or more adhesion layers deposited between the substrate and the first layer system for improving adhesion of the first layer system to the substrate, preferably a CrN layer can be used as adhesion layer. This adhesion layer or in case of more than one adhesion layer is deposited, the total thickness of the adhesion layers is preferably not higher than 1 micrometer. However, the layer thickness of the adhesion layer or of the sum of adhesion layers can be also higher than 1 micrometer, but preferably not higher than 1.5 micrometer.

Each one of the above-mentioned embodiments and preferred embodiments of the present invention can include a $Cr_2O_3$ layer as top layer of the coating, it means as outermost layer of the second layer system for improving performance, especially regarding abrasive wear resistance. This outermost layer is preferably deposited having a layer thickness of 1 micrometer or more. However, the layer thickness of this outermost layer can be also less than 1 micrometer, but preferably not less than 0.5 micrometer.

The thickness of the first layer system is preferably higher than 1 micrometer, more preferably higher than 2 micrometers. However, the layer thickness of the first layer system can be also less than 1 micrometer, but preferably not less than 0.5 micrometer.

The thickness of the second layer system is preferably higher than 2 micrometers, more preferably higher than 2.5 micrometers. However, the layer thickness of the first layer system can be also less than 2 micrometers, but preferably not less than 1.5 micrometer.

The thickness of the second layer system is preferably higher than the layer thickness of the first layer thickness.

Coatings according to the present invention are preferably deposited having a total coating thickness between 1 and 30 micrometers, more preferably between 2.5 micrometers and 20 micrometers. However, this preferred coating thickness range should not be understood as a limitation of the invention. In general, the total coating thickness as well as the thickness of the individual layers or layer systems can be selected depending on the application of the tool or the use of the substrate.

Coatings according to the present invention are especially suitable for improving performance and increasing lifetime of injection molds used for manufacture of parts made of plastics materials, for example polyester materials.

In order to show improvements attained with the inventive coatings in more detail, a further example will be described as showcase coating below:

This showcase coating was deposited on surfaces of injection molding tools (e.g. injection molds or parts of injection molds) to be in contact with the work piece material by using physical vapour deposition (PVD) techniques of the type reactive cathodic arc evaporation. During coating deposition, Cr-targets and/or AlCr-targets were arc evaporated in a coating chamber comprising nitrogen gas and/or oxygen gas as reactive gas. In this particular showcase the AlCr-targets were selected having element composition in atomic percentage of 70 at.-% Al and 30 at.-% Cr. This showcase coating was deposited comprising an adhesion layer of CrN deposited directly of the surface of the injection molding tool to be coated, subsequently a first layer system (also called corrosion layer system in the context of the present invention) comprising one layer of AlCrN and one layer of AlCrO was deposited on the adhesion layer, subsequently a transition layer system (transition layer system=two or more transition layers) comprising one transition layer of $Cr_2O_3$ and one transition layer of CrON was deposited on the first layer system, subsequently a second layer system (also called abrasive layer system in the context of the present invention) comprising a plurality of layers deposited alternate one of each other as layer sequences, each layer sequence comprising layers of CrN, layers of CrON and layers of CrO and comprising also a $Cr_2O_3$ layer as outermost layer, was deposited on the transition layer system. For some real application tests, the as they are for example shown in FIG. 6, the showcase coating was deposited having a total coating thickness between 6 and 8 micrometers.

The inventive coatings can be applied on previously nitrided substrate, e.g. on previously nitride surfaces of injection molding tools.

The inventive coatings are preferably deposited by any PVD method, for example arc PVD or sputtering PVD by maintaining preferably a substrate temperature between 250° C. and 450° C. However, this preferred substrate temperature during coating should not be understood as a limitation of the invention.

Preferably the deposition of the nitride layers (e.g. CrN and AlCrN) is carried out by applying a DC substrate bias at the substrate, while the deposition of the oxygen containing layers (e.g. oxide or oxynitride layers such as CrO, $Cr_2O_3$ and CrON layers) is preferably carried out by applying a bipolar bias.

Preferably for the deposition of layers comprising nitrogen and/or oxygen which are deposited subsequently one on each other, the nitrogen flow and the oxygen flow entering in the coating chamber are correspondingly increased and/or decreased gradually for producing a sequence of layers or simply layers deposited one on each other, for example for depositing first a CrN layer, afterwards a CrON layers and afterwards a CrO layer, then the Cr-targets can be evaporated initially by maintaining a determined nitrogen flow entering in the coating chamber for depositing the CrN layer, subsequently a oxygen flow can introduced and increased gradually in the coating chamber, while the nitrogen flow can be maintained or decreased gradually for the deposition of the CrON layer, and finally the nitrogen flow can be reduced gradually till 0 sccm, while the oxygen flow is maintained or increased or reduced gradually till a determined oxygen flow for the deposition of the CrO layer. A similar process can be carried out in reverse for depositing a reverse sequence of layers, e.g. CrO→CrON→CrN.

The inventive coatings are suitable for coating any kind of substrate material. In the case of applications in the field of plastic forming processes (e.g. injection molding and extrusion) the substrates materials are dominantly different kinds of steels.

During deposition of oxygen containing layers, in particular during deposition of oxide layers the inventors recommend using oxygen flows adjusted for the coating device that is being used and the coating conditions, e.g. kind of target material and quantity of targets being evaporated. It is recommended to find an oxygen flow range in which the mechanical properties as well as the density of the coating morphology are appropriate for the intended application. A "too high oxygen content in the coating chamber can lead to poor mechanical properties as well as an under-dense morphology of the oxygen-containing layer being deposited.

During deposition of some inventive coatings comprising for example a layer sequence of the type CrN→CrNO→CrO the oxygen flow was ramped up and the nitrogen flow was ramped down. For example, the oxygen flow was ramped up from 200 sccm to 600 sccm for the deposition of the CrNO and CrO layers and the nitrogen flow was ramped down from 1100 sccm to 100 sccm for the deposition of the CrN and CrNO layers. For deposition of reverse sequences, e.g. CrO→CrNO→CrN the oxygen and nitrogen flows were likewise ramped up and ramped down but in a reverse manner.

Figure 6:
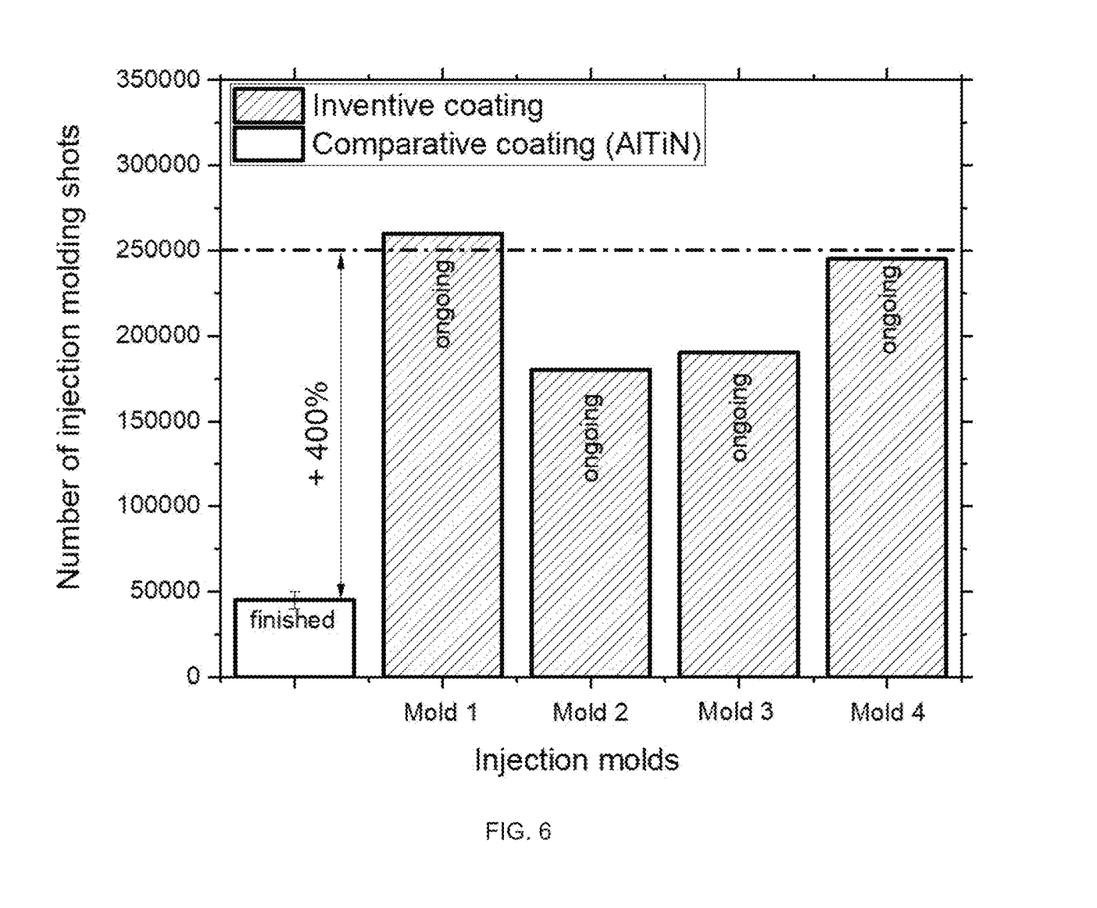
FIG. 6 shows the results obtained by injection molding (application tests under real conditions) of four injection molds (identified as as Mold 1, Mold 2, Mold 3 and Mold 4 in FIG. 6) coated with an inventive coating deposited in the same manner that the showcase coating described above and one injection mold coated with a prior art coating of the type AlTiN.

FIG. 6 shows the results obtained by injection molding (application tests under real conditions) of four injection molds (identified as as Mold 1, Mold 2, Mold 3 and Mold 4 in FIG. 6) coated with an inventive coating deposited in the same manner that the showcase coating described above and one injection mold coated with a prior art coating of the type AlTiN. These results allow quantifying the improvement obtained by the present invention comparing the number of injection molding shots (produced parts, in this case produced electrical switches) realized with molds coated with AlTiN and molds coated according to the present invention.

As it is indicated in the graphic shown in FIG. 6, with the mold coated with the prior art AlTiN coating only 40'000 to 50'000 shots could be attained before the coated mold turned no more operational (average lifetime was approximately 50'000 shots). With the molds coated with coatings according to the present invention the improvement was considerably high, even in one case more than 400% and these molds coated with inventive coatings were still operational. The work piece material used in these tests was unsaturated polyester with 30% glass fiber, the produced parts were electrical switches.

A coating deposited on a substrate, the coating comprising a first layer or a first layer system comprising at least one corrosion resistant material layer; a second layer or a second layer system comprising at least one abrasion resistant material layer; and a transition layer provided between the first layer and the second layer, wherein the first layer or first layer system is deposited closer to the substrate than the second layer or second layer system has been disclosed in the present invention.

This coating has the advantage in comparison with coatings having only an abrasion resistance part, e.g. a multilayer structure of the type . . . CrN/CrON/CrN/CrON . . . that the mentioned abrasion resistant part only provides a good abrasion resistance but a poor corrosion resistance.

Including a corrosion resistant part closer to the substrate, e.g. at least one AlCrO layer improves corrosion resistance because the AlCrO layer acts as barrier for corrosion. Including furthermore an AlCrN layer between the AlCrO layer and the substrate, it is possible to have the corrosion barrier effect but improving adhesion of the coating to the substrate. Likewise, including an adhesion layer e.g. of the type CrN it is possible to attain a much better adhesion of the corrosion resistant part to the substrate.

The transition layers improve cohesion of the coating by improving adhesion between the corrosion resistant part and the abrasion resistant part of the coating.

The use of a $Cr_2O_3$ outermost layer increase performance of the coating, especially by applications including processing of plastic materials, e.g. injection molding, because AlCrO reduce tendency to stick to plastic materials during processing of the work piece (because of effect of less chemical affinity to plastic materials).

The first layer or a first layer system includes preferably one or more layers of the following materials: aluminum chromium oxide (AlCrO), aluminum chromium oxynitride (AlCrON), chromium oxides ($CrO_x$), and chromium (III) oxide ($Cr_2O_3$).

The second layer or second layer system includes preferably one or more layers of the following materials: chromium (Cr), chromium nitride (CrN), chromium oxynitride (CrON), chromium oxides ($CrO_x$), and chromium (III) oxide ($Cr_2O_3$).

Preferably the second layer or the second layer system has a hardness between 29 GPa and 33 GPa measured by using known nano-indentation techniques.

The first layer or first layer system can be in one embodiment a multilayer part including at least one of AlCrO, AlCrON, $CrO_x$, and $Cr_2O_3$.

The second layer or second layer system can be in one embodiment a multilayer part including at least one of Cr, CrN, CrON, $CrO_x$, and $Cr_2O_3$.

The first layer or first layer system is intended to insulate the substrate from outward diffusions of electrons and inward diffusions of corrosive ions from an environment.

The transition layer or transition layer system is intended to mitigate delamination between the first layer and the second layer.

The chemical composition of the first layer or first layer system is different from the chemical composition of the second layer or second layer system.

In one embodiment the crystal structures and lattice parameters of the first layer or first layer system can be different from the crystal structures and lattice parameters of the second layer or second layer system.

The present invention relates also to a method of coating a substrate, comprising:
  providing a substrate;
  applying a multilayer corrosive resistant part to the substrate;
  applying at least one transition layer to the multilayer corrosive resistant part; and
  applying a multilayer abrasive resistant part to the at least one transition layer.

The substrate coated with a coating according to the present invention can include a ferrous metal surface on which the coating is deposited.

In one further embodiment the multilayer corrosive resistant part comprises at least one of the following materials: AlCrO, AlCrON, $CrO_x$, and $Cr_2O_3$ and/or the multilayer abrasive resistant part comprises at least one of the following materials: Cr, CrN, CrON, $CrO_x$, and $Cr_2O_3$.

In particular a coating according to the present invention can be used in plastic processing applications. The coating is resistant to both abrasion and corrosion, while maintaining ductility and impact resistance.

According to a preferred embodiment of a coating according to the present invention, the inventive coating is deposited on a surface of a substrate and is characterized by comprising:
  a first layer comprising at least one corrosion resistant material layer;
  a second layer comprising at least one abrasion resistant material layers; and
  a transition layer provided between the first layer and the second layer,
  wherein the first layer is deposited closer to the substrate than the second layer,
wherein
  the first layer is part of a first layer system deposited closer to the substrate than the second layer, said first layer system comprising one or more corrosion resistant layers, wherein one corrosion resistant layer is preferably an AlCrO layer.

Preferably the second layer is part of a second layer system deposited more distant from the substrate than the first layer system, said second layer system comprising one or more abrasion resistant layers, one abrasion resistant layer being a CrON layer.

Preferably the transition layer is part of a transition layer system, said transition layer system comprising one or more transition layers, one transition layer being a CrON layer.

Preferably the transition layer system comprises a $Cr_2O_3$ layer. Preferably the second layer system comprises at least one CrN layer and/or at least one CrO layer.

Preferably the second layer system comprises at least one $Cr_2O_3$ layer deposited as outermost layer.

Preferably, when the first layer system comprises at least one AlCrO layer, at least one AlCrN layer is deposited between the substrate and the AlCrO layer.

Preferably at least one adhesion layer is deposited between the substrate and the first layer or between the substrate and the first layer system.

Preferably the at least one adhesion layer is a CrN layer.

The invention claimed is:

1. A coating deposited on a surface of a tool for use in plastic processing, comprising:
  a first layer or first layer system that comprises at least one corrosion resistant material layer;
  a second layer system comprising abrasion resistant material layers; and
  a transition layer provided between said first layer or said first layer system and said second layer system,
  wherein:
  said first layer or said first layer system is deposited closer to the tool than said second layer system;
  said second layer system comprises more than one abrasion resistant layers;

at least one of said abrasion resistant layers is a CrON layer; and said transition layer is part of a transition layer system, wherein at least one transition layer being a CrON layer.

2. The coating according to claim 1, wherein said second layer system comprises at least one CrN layer.

3. The coating according to claim 1, wherein said second layer system comprises at least one layer made of a material selected from the group consisting of chromium (Cr), chromium nitride (CrN), chromium oxides ($CrO_x$), and chromium (III) oxide ($Cr_2O_3$).

4. The coating according to claim 1, wherein said second layer system is characterized by a hardness that ranges between 29 GPa and 33 GPa.

5. The coating according to claim 1, wherein said second layer system is a multilayer part that comprises at least one of Cr, CrN, CrON, $CrO_x$, and $Cr_2O_3$.

6. A tool for use in plastic processing having a coating according to claim 1 deposited on a surface thereof, wherein said surface is made of a material that comprises a ferrous metal or steel.

7. The tool according to claim 6, wherein the substrate is an injection mold used for manufacture of parts made of plastic materials.

8. A coating deposited on a surface of a tool for use in plastic processing, comprising:
  a first layer or a first layer system that comprises at least one corrosion resistant material layer;
  a second layer system that comprises at least one abrasion resistant material layer;
  a transition layer or a transition layer system provided between said first layer or said first layer system and said second layer system; and
  at least one adhesion layer deposited between the tool for use in plastic processing and said first layer or said first layer system, said at least one adhesion layer comprises a CrN layer, wherein:
  said first layer or said first layer system is deposited closer to the substrate than said second layer system,
  said at least one abrasion resistant layer is a CrON layer, and
  said transition layer or said transition layer system comprises at least one CrON layer, and said second layer system comprises at least one CrN layer.

* * * * *